United States Patent [19]

Kaufmann

[11] Patent Number: 5,600,295
[45] Date of Patent: Feb. 4, 1997

[54] THERMAL FUSE AND METHOD FOR THE ACTIVATION THEREOF

[75] Inventor: August Kaufmann, München, Germany

[73] Assignee: Siemens Aktiengesellschaft, Munich, Germany

[21] Appl. No.: 351,433

[22] PCT Filed: Jun. 8, 1993

[86] PCT No.: PCT/DE93/00496

§ 371 Date: Dec. 15, 1994

§ 102(e) Date: Dec. 15, 1994

[87] PCT Pub. No.: WO93/26028

PCT Pub. Date: Dec. 23, 1993

[30] Foreign Application Priority Data

Jun. 15, 1992 [DE] Germany ............... 42 19 554.3

[51] Int. Cl.$^6$ ................................................ H01H 37/76
[52] U.S. Cl. ........................... 337/405; 337/402; 337/407
[58] Field of Search ..................... 337/290, 362, 337/401–409; 361/103, 104; 29/623

[56] References Cited

U.S. PATENT DOCUMENTS 4,135,176 1/1979 McVey et al. .................... 337/404

5,280,262 1/1994 Fischer ........................ 337/405

FOREIGN PATENT DOCUMENTS

| 1515624 | 4/1970 | Germany. |
| 3825897 | 2/1990 | Germany. |
| 3930819 | 3/1991 | Germany. |
| 2077500 | 12/1981 | United Kingdom. |

Primary Examiner—Leo P. Picard
Assistant Examiner—Jayprakash N. Gandhi
Attorney, Agent, or Firm—Hill, Steadman & Simpson

[57] ABSTRACT

The thermal fuse has a spring clip (1) with solder locations (5, 6) at both ends as well as a bending section (4) in the region between the solder locations. Given a tension-free spring clip, the spacing between the solder locations (5, 6) corresponds to the regular spacing of the appertaining circuit contacts (15, 16) of the substrate. After the spring clip has been soldered onto the circuit contacts (15, 16), the bending section (4) is deformed such by applying force that a pre-stress arises in the spring arms (2, 3) of the spring clip.

7 Claims, 1 Drawing Sheet

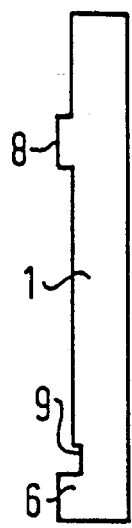
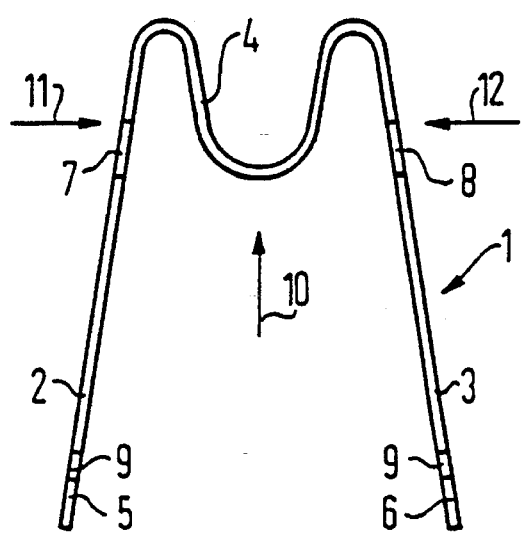
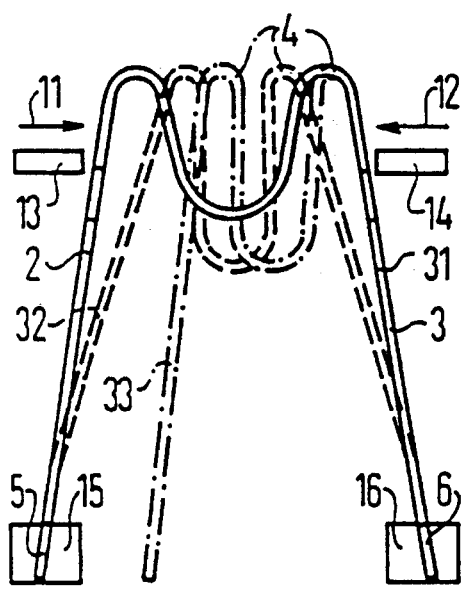
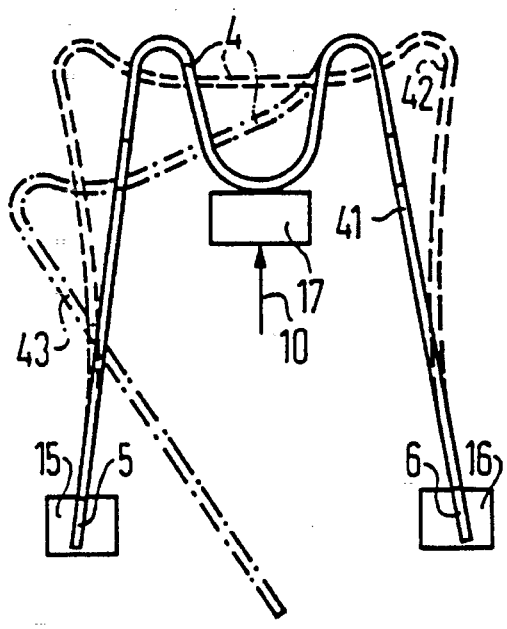

THERMAL FUSE AND METHOD FOR THE ACTIVATION THEREOF

BACKGROUND OF THE INVENTION

The invention is directed to a thermal fuse for fixing on a circuit substrate in the form of a spring clip which comprises two contact locations, whereof at least one is a solder location for connection to corresponding circuit contacts of the substrate as well as at least one elastic spring arm as connecting section between the two contact locations. The invention is also directed to a method for the activation of such a thermal fuse.

Such fuses serve the purpose of protecting circuit parts against thermal overload and can be utilized in any desired circuits, for instance on printed circuit boards. The preferred area of employment of the thermal fuse of the invention, however, are film circuits.

In general, thermal fuses of the species initially cited are variously known and for various employments, for example from DE-B-15 15 624. In the fuse shown therein, the spring arm is pre-stressed into its working position when the fuse is built in. It must thus be retained in the pre-stressed position with a special device during soldering and until the soldered connection has cooled. Particularly given film circuits, this requires complicated manipulation and complicated devices.

In order to avoid soldering under tension, it has likewise already been proposed (DE-A-38 25 897 and DE-A-39 30 819) to support the spring arms of a U-shaped fuse clip in their prestressed position with applied support elements. No clamp or retainer devices are thus required during soldering; the support elements, however, must be removed or bent off after soldering in order to allow the tension of the spring arms to take effect. An object of the present invention is to enable an even simpler fashioning of a thermal fuse wherein neither a pre-stress mount during soldering nor a separate support element at the spring arms themselves are required.

SUMMARY OF THE INVENTION

Given a thermal fuse of the species initially cited, the object is inventively achieved in that the spring clip comprises a plastically deformable bending section in the region between the two contact locations, and in that the spacing between the two contact locations given a tension-free spring arm corresponds to the regular spacing of the circuit contacts of the substrate, and in that a tension can be produced in the spring clip by deforming the bending section, said tension striving to change the spacing between the two contact locations.

This thermal fuse, further, is inventively produced in such a way that the spring clip has its solder locations placed tension-free onto the solder contacts of the circuit substrate and is soldered, and in that a pre-stress directed to modifications of the spacing between the solder locations is produced by deformation of the bending section in the spring clip.

In the invention, thus, the pre-stress of the spring arm or of the spring arms is not undertaken until after soldering on the circuit substrate has been carried out. As a result thereof, the form of the spring clip is especially simple and economical in terms of manufacture as well as in terms of manipulation during soldering, since support elements also need not be applied and subsequently removed. The pre-stress event can be implemented in a simple way on the circuit substrate with simple bending punches and requires no more outlay than, example, the removal of the support element given the thermal fuse of DE-A-38 25 897.

Additional features and advantages of the present invention are described in, and will be apparent from, the detailed description of the presently preferred embodiments and from the drawings.

BRIEF DESCRIPTION OF THE DRAWINGS

The invention shall be set forth in greater detail below with reference to exemplary embodiments on the basis of the drawing. Shown are:

FIG. 1 illustrates a side elevation of an inventively fashioned thermal fuse, according to the present invention.

FIG. 2 illustrates a front elevation of the thermal fuse of FIG. 1. FIG. 3 illustrates the thermal fuse of FIG. 2 in three phases: soldered in an unstressed condition; after deformation (shown in phantom); and after fusing (shown in phantom).

FIG. 4 illustrates the thermal fuse of FIG. 2 in three stages as in FIG. 3, but wherein the fuse has a different deformation.

DETAILED DESCRIPTION OF THE PRESENTLY PREFERRED EMBODIMENTS

The thermal fuse shown in FIGS. 1 and 2 the drawing is composed of a spring clip 1 that is cut from strip stock and shaped. It has two spring arms 2 and 3 that are interconnected via an M-shaped bending section 4. Solder supports 5 and 6 are applied at the ends of the spring arms, the spring clip being soldered with said solder supports 5 and 6 to corresponding solder contacts of a circuit, preferably a film circuit. So that the circuit substrate is not continuously touched given horizontal integration, the spring clip also comprises additional support tabs 7 and 8. A lightning arc-over is thus avoided given employment in the circuit. Notches 9 that prevent the solder from flowing off and thus assure a high solder quality are also provided next to the solder supports.

The tension-free form of the spring clip shown in FIG. 2 is already bent such during manufacture that the spacing between the solder supports 5 and 6 without pre-stress corresponds to the regular spacing of the solder contacts on the circuit substrate to which the solder supports of the thermal fuse are to be connected. The required pre-stress on the circuit substrate is produced as a result of subsequent deformation, for example by applying force approximately parallel to the spring legs in the direction of the arrow 10 or transversely relative to the spring legs in the direction of the arrows 11 and 12.

FIG. 3 shows the shape of the spring clip of FIG. 2 in various phases of employment on a circuit. In the first phase, namely while being soldered in on the circuit substrate, the spring clip has the shape as in FIG. 2. It is referenced 31 in FIG. 3 and is shown with solid lines. The solder supports 5 and 6 are thereby placed onto solder contacts 15 and 16 of a circuit substrate (not shown in greater detail) and are contacted with a standard soldering process, for example by reflow soldering. Subsequently, pressure is exerted on the M-shaped bending section 4 from two sides with bending punches 13 and 14, so that the spring clip is lent the shape 32 overall that is shown with broken lines. The bending section 4 is thereby plastically deformed, whereas the spring arms 2 and 3 are lent a pre-stress.

When, finally, the fuse is triggered in that the solder on the solder contact 15 melts, the spring clip detaches from the circuit substrate at the appertaining side; the pre-stressed spring legs 2 and 3 then again assume their original shape, whereas the bending section 4 remains in the deformed shape. The spring clip is thus lent the shape 33 overall that is shown dot-dashed.

FIG. 4 shows a somewhat modified activation form. In this case, the bending section 4 is deformed in the direction of the arrow 10 with a bending punch 17 after soldering onto the solder contacts 15 and 16, so that the pre-stress phase having the shape 42 (shown with broken lines) now arises from the phase 41 having the original shape. When the fuse responds, the solder support 5 departs from the solder contact 15. The shape 43 shown with dot-dashed lines arises.

The bending section and the spring arms can assume any desired shapes. It is important, however, that a tension arises in some part of the spring clip as a result of deformation of the bending section after soldering, this tension attempting to change the spacing between the two solder supports.

Although other modifications and changes may be suggested by those skilled in the art, it is the intention of the inventors to embody within the patent warranted hereon all changes and modifications as reasonably and properly come within the scope of their contribution to the art.

I claim:

1. A thermal fuse for fixing on a circuit substrate said fuse being formed by a spring clip comprising;

two contact locations whereof at least one is a solder location for connection to corresponding two circuit contacts of the substrate;

at least one elastic spring arm as a connecting section between the two contact locations; and a plastically deformable bending section of the spring arm between the two contact locations such that a spacing between the two contact locations when said spring arm is tension-free corresponds to a regular spacing between the circuit contacts of the substrate, wherein a tension can be produced in the spring clip by deforming the bending section, said tension causing a bias between the two contact locations.

2. The thermal fuse according to claim 1, wherein there are two said non-prestressed spring arms connected to one another via said plastically deformable bending section, said contact locations being disposed at respective free ends of said spring arms, whereby the spacing between the two contact locations in a tension-free condition corresponds to the regular spacing between the circuit contacts of the circuit substrate.

3. The thermal fuse according to claim 1 wherein the spring clip is cut from a spring strip and is bent.

4. The thermal fuse according to claim 1, wherein the spring clip further comprises:

solder supports applied to its underside for horizontal integration.

5. The thermal fuse according to claim 4, further comprising:

a notch adjacent to each solder support.

6. The thermal fuse according to claim 4 further comprising:

support tabs in the region of the bending section.

7. The thermal fuse according to claim 1 wherein the bending section is generally M-shaped.

* * * * *